(12) United States Patent
Kim

(10) Patent No.: US 7,221,324 B2
(45) Date of Patent: May 22, 2007

(54) ANTENNA COUPLING STRUCTURE FOR A MOBILE TERMINAL

(75) Inventor: Young-Il Kim, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/131,820

(22) Filed: May 18, 2005

(65) Prior Publication Data

US 2005/0259014 A1 Nov. 24, 2005

(30) Foreign Application Priority Data

May 20, 2004 (KR) .................. 10-2004-0036095

(51) Int. Cl.
*H01Q 1/24* (2006.01)
(52) U.S. Cl. .................................. 343/702
(58) Field of Classification Search ............... 343/702, 343/906, 900, 901
See application file for complete search history.

(56) References Cited

U.S. PATENT DOCUMENTS

| | | | |
|---|---|---|---|
| 6,166,697 A | 12/2000 | Granqvist et al. | |
| 6,215,446 B1 | 4/2001 | Sullivan et al. | |
| 6,262,693 B1 | 7/2001 | Sutter et al. | |
| 6,369,775 B1 | 4/2002 | Moore et al. | |
| 6,441,788 B1* | 8/2002 | Ishizuka et al. | ............ 343/702 |
| 2001/0004248 A1 | 6/2001 | Takagi et al. | |

FOREIGN PATENT DOCUMENTS

EP  1 079 459 A  2/2001

* cited by examiner

*Primary Examiner*—Trinh Vo Dinh
(74) *Attorney, Agent, or Firm*—Lee, Hong, Degerman, Kang & Schmadeka, P.C.

(57) ABSTRACT

An apparatus is disclosed for a mobile terminal comprising an antenna, a printed circuit board installed in a terminal body and an antenna receiving portion formed on one side of the terminal body for mounting the antenna. The antenna is slidably-inserted in the antenna receiving portion to elastically and electrically couple the antenna to an antenna contact portion on the printed circuit board.

18 Claims, 6 Drawing Sheets

ANTENNA COUPLING STRUCTURE FOR A MOBILE TERMINAL

CROSS-REFERENCE TO RELATED APPLICATIONS

Pursuant to 35 U.S.C. § 119(a), this application claims the benefit of earlier filing date and right of priority to Korean Application No. 10-2004-036095, filed on May 20, 2004; the contents of which are hereby incorporated by reference herein in its entirety.

FIELD OF THE INVENTION

The present invention relates to a mobile terminal and an antenna and, more particularly, to a mobile terminal having an antenna coupling structure providing improved mobile terminal assembly characteristics and contact characteristics between an antenna and a printed circuit board.

BACKGROUND OF THE INVENTION

Generally, a mobile terminal is a wireless communication device that allows a user, moving from one location to another, to communicate with another user. A modern mobile terminal not only transmits and receives voice but also transmits and receives information for multimedia functions. An antenna plays an important role in determining the functionality of the mobile terminal.

FIG. 1 is a perspective view illustrating an antenna mounting structure of a mobile terminal in accordance with the related art. FIG. 2 is a longitudinal section view illustrating a coupling structure between an antenna and a bushing of a related art mobile terminal.

Referring to FIGS. 1 and 2, a related art mobile terminal 10 provides a terminal body 12 including a printed circuit board 11 for inputting information and controlling communication. A folder, not shown, may be installed on the terminal body 12 for opening and closing the related art mobile terminal 10. A hinge portion, not shown, may be provided for opening and closing the folder within a specified rotational range. An antenna 15 is installed at an upper end of the terminal body 12. The antenna 15 transmits and receives a wireless communication signal.

An antenna receiving portion 16, integrally formed within the terminal body 12, protrudes from one side of the terminal body 12.

A male screw portion 15a of the antenna 15 screws in the antenna receiving portion 16. The screw portion 15a couples to a female screw portion 17a formed in a bushing 17, where the bushing 17 is formed of a metal material and installed in the terminal body 12.

A tension portion 17b is installed on an outer circumferential surface of the bushing 17. The tension portion 17b electrically connects a contact portion 11a of the printed circuit board 11 to the antenna 15.

In the related art mobile terminal 10, the bushing 17 affixes the antenna 15 to the antenna receiving portion 16. To complete assembly of the related art mobile terminal 10, the antenna 15 is required to be screw-coupled to the bushing 17, where the screw-coupling increases assembly time of the related art mobile terminal 10.

Thus, there is a need for an improved apparatus to couple an antenna to a mobile terminal.

SUMMARY OF THE INVENTION

Features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

An object of the present invention is to provide a mobile terminal having an antenna coupling structure providing improved mobile terminal assembly characteristics and contact characteristics between an antenna and a printed circuit board.

In accordance with one embodiment, there is provided a mobile terminal comprising an antenna, a printed circuit board installed in the terminal body, an antenna receiving portion formed on one side of a terminal body to mount an antenna, and an antenna slidably-inserted in the antenna receiving portion to elastically and electrically couple the antenna to an antenna contact portion on the printed circuit board.

In accordance with another embodiment of the present invention, an antenna of a mobile terminal comprises a body exposed to outside of an antenna receiving portion on one side of the mobile terminal, and a coupling portion extendably formed at a lower portion of the body. A tension portion is provided that is affixed to the coupling portion, wherein one end of the tension portion elastically contacts the antenna contact portion. A coupling unit couples the coupling portion and the tension portion.

The tension portion may be bent so as to elastically contact the antenna contact portion. A guide protrusion and a guide groove, in one example, are formed on an inner circumferential surface of the antenna receiving portion and a corresponding outer circumferential surface of the coupling portion, respectively.

A locking protrusion and a locking groove, in one example, is formed at an inner circumferential surface of the antenna receiving portion and a corresponding end of the coupling portion, respectively. An embossing protrusion, in one example, configured to removably connect to the antenna contact portion formed at one end of the tension portion.

The foregoing and other objects, features, aspects and advantages of the present invention will become more apparent from the following detailed description of the present invention when taken in conjunction with the accompanying drawings.

Additional features and advantages of the invention will be set forth in the description which follows, and in part will be apparent from the description, or may be learned by practice of the invention. It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

Features, elements, and aspects of the invention that are referenced by the same numerals in different figures represent the same, equivalent, or similar features, elements, or aspects in accordance with one or more embodiments.

DETAILED DESCRIPTION OF THE PREFERRED EMBODIMENTS

The present invention relates to an antenna mounting structure of a mobile terminal. Reference will now be made in detail to the preferred embodiments of the present invention, examples of which are illustrated in the accompanying drawings.

Figure 1:
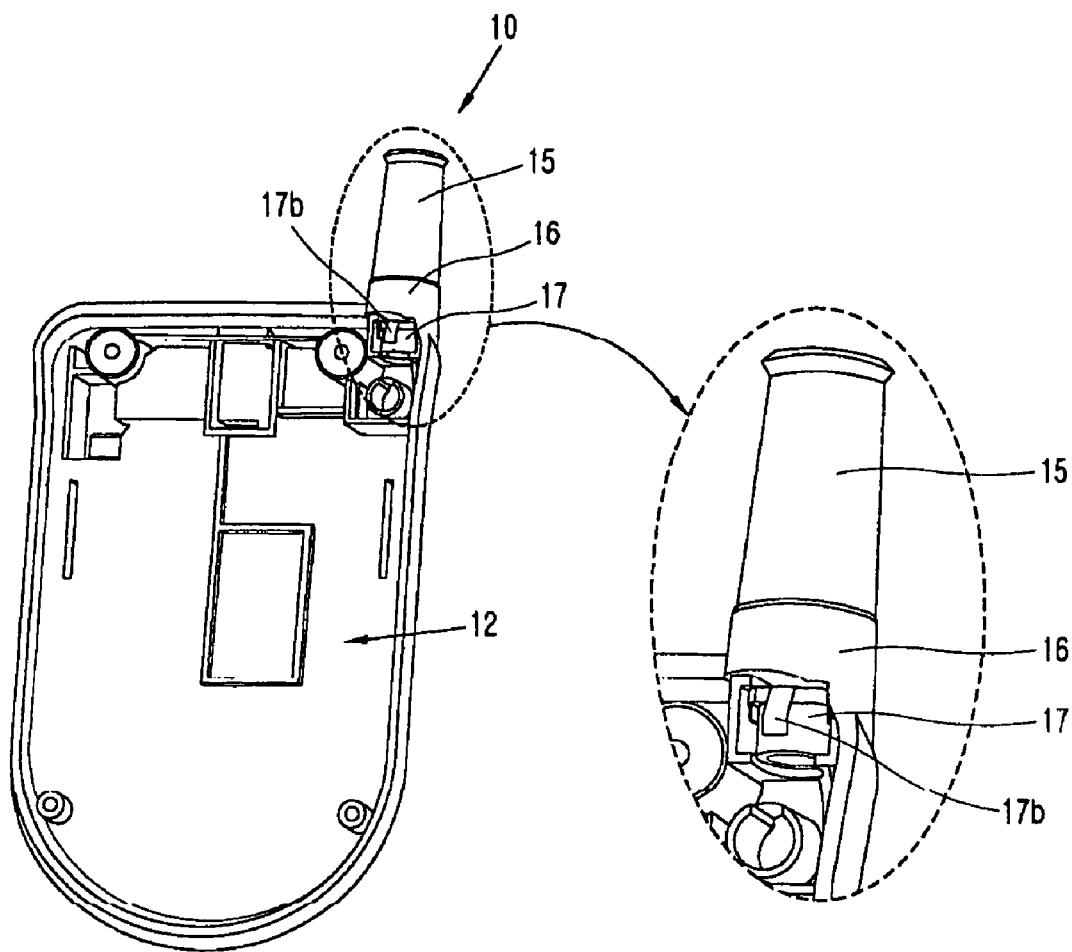
FIG. 1 is a perspective view illustrating an antenna mounting structure of a related art mobile terminal.
Figure 2:
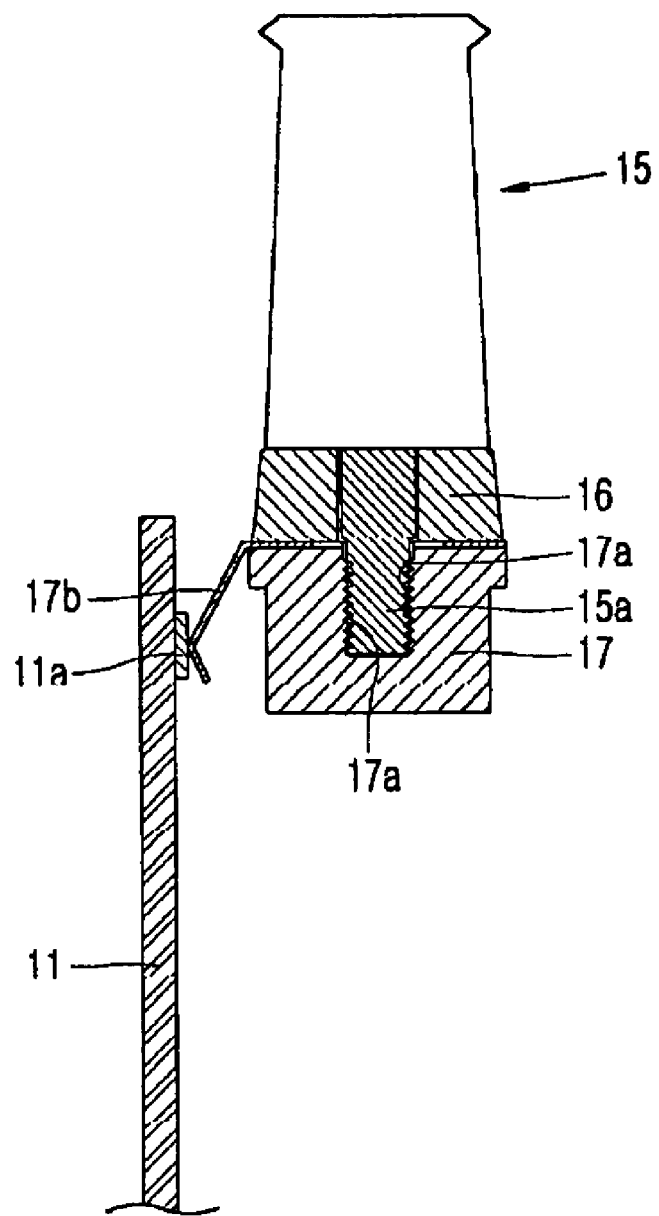
FIG. 2 is a longitudinal section view illustrating a coupling structure between an antenna and a bushing of the related art mobile terminal.
Figure 3:
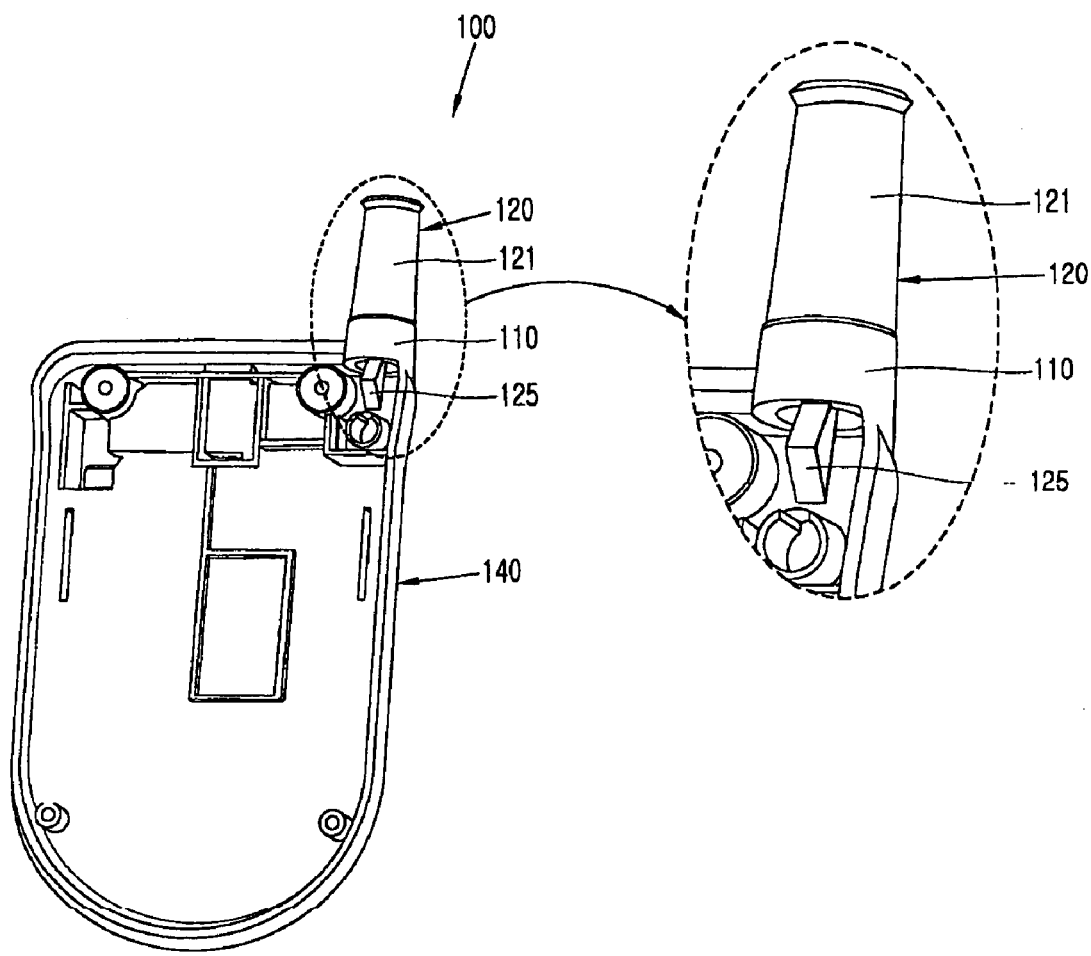
FIG. 3 is a perspective view illustrating an antenna mounting structure according to one embodiment of the present invention.
Figure 4:
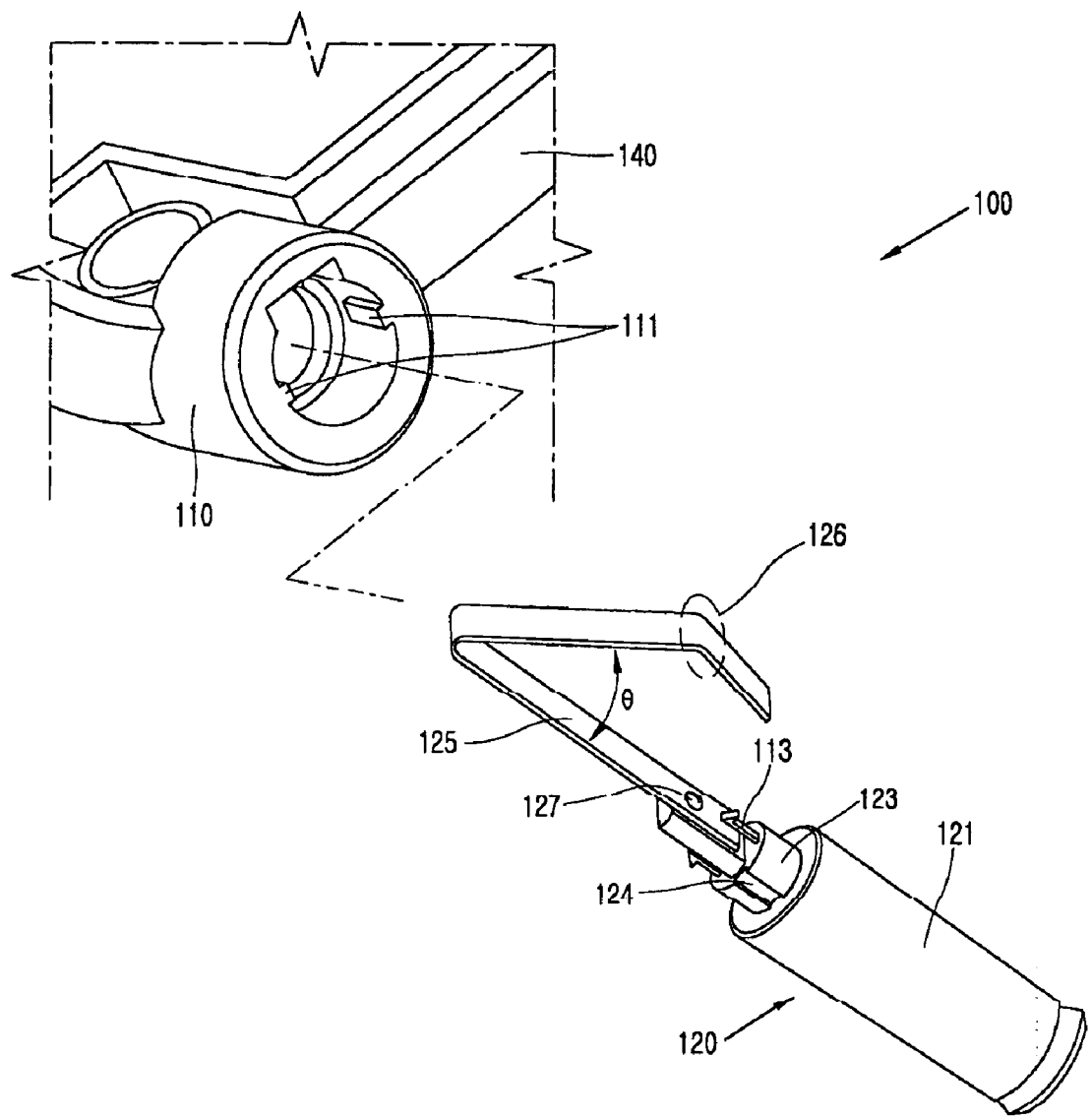
FIG. 4 is a disassembled perspective view illustrating a coupling structure between an antenna and a bushing of the mobile terminal according to one embodiment of the present invention.
Figure 5:
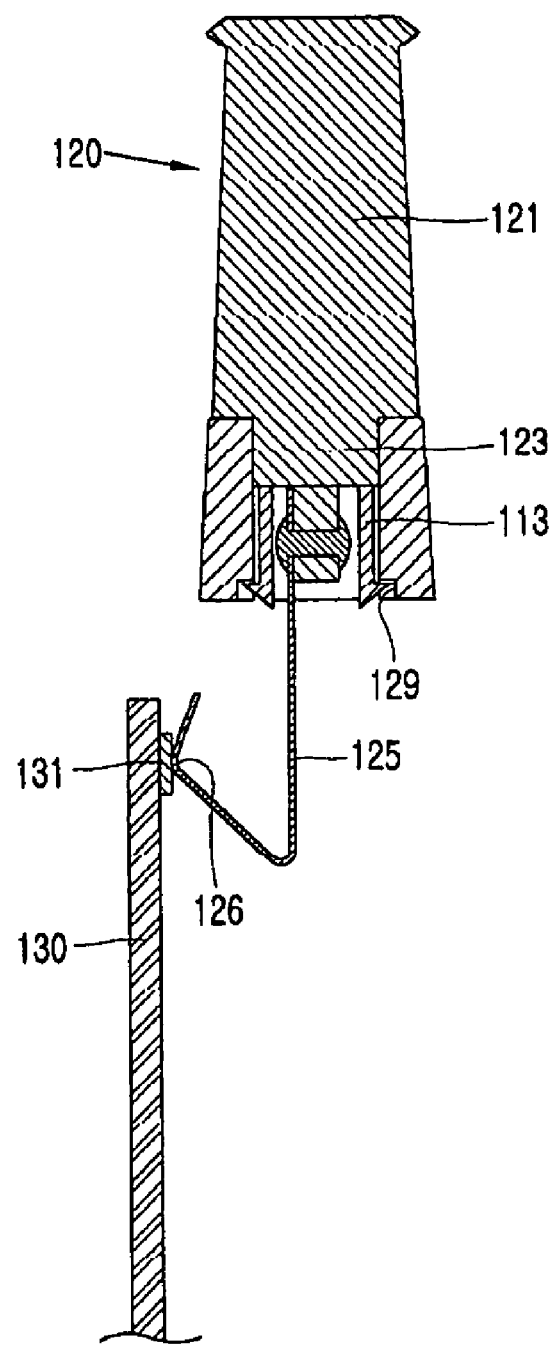
FIG. 5 is a longitudinal section view illustrating the coupling structure between the antenna and the bushing of the mobile terminal according to one embodiment of the present invention.

Referring to FIGS. 3–5, a mobile terminal 100 provides an antenna receiving portion 110 formed at one side of a terminal body 140 for mounting an antenna 120. The antenna 120 is slidably-inserted in the antenna receiving portion 110. The antenna receiving portion 110 elastically and electrically connects the antenna 120 to an antenna contact portion 131 (See FIG. 5). The antenna contact portion 131 is, for example, located on a printed circuit board 130 and installed in the terminal body 140.

The antenna 120 provides a body 121 exposed outside of the antenna receiving portion 110. A coupling portion 123 (FIGS. 4,5) is extendably formed at a lower portion of the body 121. A tension portion 125 is affixed to the coupling portion 123. A portion 126 at one end of the tension portion 125 elastically contacts the antenna contact portion 131. A coupling unit 127 couples the coupling portion 123 and the tension portion 125.

The portion 126, in this example, is a middle portion of the tension portion 125 that bends, approximately θ, to elastically contact the antenna contact portion 131, providing a biasing relationship between the contact portion 131 and coupling portion 123 in combination with the tension portion 125.

A guide protrusion 111 and a guide groove 124 are formed on an inner circumferential surface of the antenna receiving portion 110 and a corresponding outer circumferential surface of the coupling portion 123, respectively. As the guide protrusion 111 is inserted in the guide groove 124, the antenna 120 may be slidably-inserted, preferably smoothly, in the antenna receiving portion 110.

A locking protrusion 113 is formed at an inner circumferential surface of the antenna receiving portion 110. A locking groove 129, corresponding to the locking protrusion 113, is formed at an end of the coupling portion 123. The locking protrusion 113 and the locking groove 129 prevents the antenna 120, while inserted in the antenna receiving portion 110, from being detached from the mobile terminal 100. The locking protrusion 113 is, in this example, integrally formed with the coupling portion 123. When the tension portion 125 is inserted in the antenna receiving portion 110, the locking protrusion 113 elastically conforms within the locking groove 129 to provide firm coupling between the antenna 120 and the antenna receiving portion 110.

The tension portion 125, which is preferably formed of a metal material, electrically connects the antenna contact portion 131 to the antenna 120 to transmit and/or receive a communication signal. The coupling unit 127, in this example, is a rivet. In the alternative, the coupling unit 127 may comprise a bolt and a nut, an adhesive substance, or other connector having an equivalent functional character.

Figure 6:
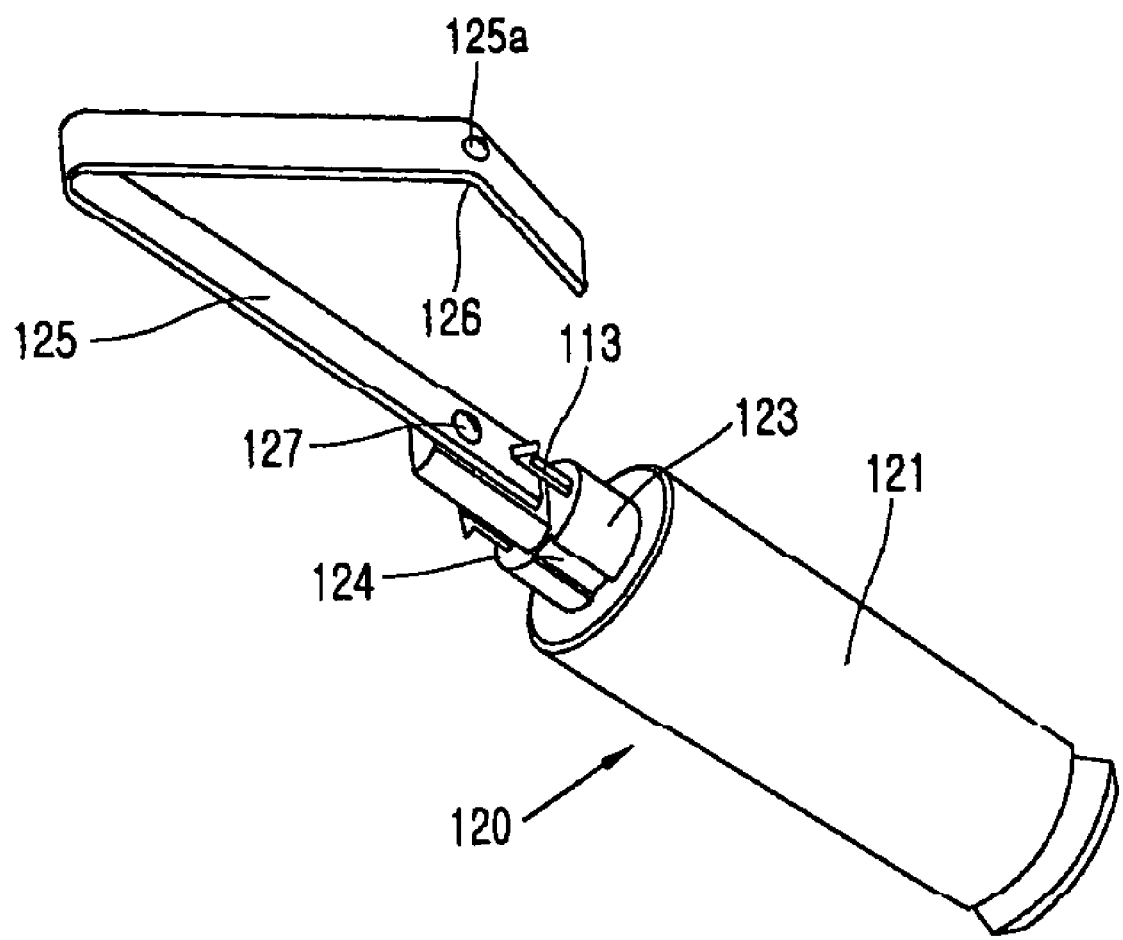
FIG. 6 is a perspective view illustrating a modified tension portion of the mobile terminal according to another embodiment of the present invention.

FIG. 6 is a perspective view illustrating a modified tension portion of the mobile terminal according to another embodiment of the present invention. As shown, an embossing protrusion 125a is formed at a middle portion 126 of the tension portion 125 of the antenna 120. The embossing protrusion 125a further increases the biasing relationship and connectivity of the tension portion 125 with the antenna contact portion 131 of the printed circuit board 130. The embossing protrusion 125a formed on a segment of the tension portion 125 is configured to removably connect to the antenna contact portion 131.

Referring to FIGS. 4 and 5, the tension portion 125 couples with a rivet 127 to the coupling portion 123 of the antenna 120. To mount the antenna 120 to the antenna receiving portion 110, the tension portion 125 is inserted in the antenna receiving portion 110 and aligned, in this example, for coupling the guide protrusion 111 within the guide groove 124.

In a preferred embodiment, the guide protrusion 111 slidably fits in the guide groove 124, providing for the antenna 120 to be, in this example, smoothly, slidably-inserted in the antenna receiving portion 110.

When a first length of the antenna 120 is inserted in the antenna receiving portion 110, the locking protrusion 113 is locked at the locking groove 129 to provide a firm attachment between the antenna 120 and the antenna receiving portion 110. The locking protrusion 113 is a hook-shaped piece in accordance with one embodiment. The tension portion 125 elastically connects to the antenna contact portion 131 of the printed circuit board 130, at portion 126.

Upon slidably-inserting the antenna 120 in the antenna receiving portion 110, the antenna 120 and the tension portion 125 elastically contact the antenna contact portion 131 to complete the electrical conductive path between the antenna 120 and the printed circuit board 130. Using the principles of the present invention, the antenna 120 may be firmly coupled to the terminal body 140 to provide improved mobile terminal assembly characteristics.

For example, firm coupling and improved electrical conductivity between the antenna 120 and the terminal body may provided by the tension portion 125, where the tension portion 125 elastically connects through the embossing protrusion 125a to the printed circuit board 130.

Although the invention is illustrated with respect to a mobile terminal, it is contemplated that the invention may be utilized wherever it is desired for decreasing antenna attachment time and increasing connectivity between an antenna and an electronic unit within a mobile communication system.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A mobile terminal comprising:

an antenna;

a printed circuit board installed in a terminal body;

an antenna receiving portion formed on one side of the terminal body to mount the antenna, wherein the antenna is slidably-inserted in the antenna receiving portion to elastically and electrically couple the antenna to an antenna contact portion on the printed circuit board, and wherein the antenna further comprises a body exposed to outside of the antenna receiving portion, a coupling portion extendably formed at a lower portion of the body, a tension portion fixed to the coupling portion and having one end elastically contacting the antenna contact portion, and a coupling unit for coupling the coupling portion and the tension portion.

2. Mobile terminal of claim 1, wherein the tension portion bends so as to accommodate a biasing contact with the antenna contact portion.

3. The mobile terminal of claim 1, further comprising a guide protrusion and a guide groove formed at an inner circumferential surface of the antenna receiving portion and a corresponding outer circumferential surface of the coupling portion, respectively.

4. The mobile terminal of claim 1, further comprising a locking protrusion and a locking groove, wherein the locking groove is formed at an inner circumferential surface of the antenna receiving portion and the locking protrusion is formed on a corresponding end of the coupling portion.

5. The mobile terminal of claim 1, wherein the tension portion comprises a metal material.

6. The mobile terminal of claim 1, wherein the coupling unit is a bolt and a nut.

7. The mobile terminal of claim 1, wherein the coupling unit is a rivet.

8. The mobile terminal of claim 1, further comprising an embossing protrusion formed on a segment of the tension portion configured to removably connect to the antenna contact portion.

9. An antenna of a mobile terminal comprising:

a body exposed to outside of an antenna receiving portion formed on one side of the mobile terminal;

a coupling portion extendably formed on a lower portion of the body;

a tension portion fixed to the coupling portion and having one end to elastically contact an antenna contact portion;

a coupling unit to couple the coupling portion and the tension portion; and a guide groove formed on an outer circumferential surface of the coupling portion to be guided by a guide protrusion formed on a corresponding inner circumferential surface of the antenna receiving portion.

10. The antenna of claim 9, wherein the tension portion bends to elastically contact the antenna contact portion.

11. The antenna of claim 9, further comprising a locking protrusion formed on an end of the coupling portion to be coupled with a locking groove, formed on an inner circumferential surface of the antenna receiving portion.

12. The antenna of claim 9 wherein the tension portion comprises a metal.

13. The antenna of claim 9, wherein the coupling unit is a bolt and a nut.

14. The antenna of claim 9, wherein the coupling unit is a rivet.

15. The antenna of claim 9, further comprising an embossing protrusion formed on a segment of the tension portion configured to removably connect to the antenna contact portion.

16. A mobile terminal comprising:

a terminal body;

an antenna having a body exposed to outside of the antenna receiving portion, a coupling portion extendably formed at a lower portion of the body, a tension portion fixed to the coupling portion and having one end elastically contacting an antenna contact portion; and a coupling unit to couple the coupling portion and the tension portion; and an antenna receiving portion formed on one side of the terminal body to mount the antenna, wherein the antenna slidably-inserted in the antenna receiving portion to elastically and electrically couple the antenna to the antenna contact portion.

17. The mobile terminal of claim 16, further comprising a guide protrusion and a guide groove formed at an inner circumferential surface of the antenna receiving portion and a corresponding outer circumferential surface of the coupling portion, respectively.

18. The mobile terminal of claim 16, further comprising a locking protrusion and a locking groove, wherein the locking groove is formed at an inner circumferential surface of the antenna receiving portion and the locking protrusion is formed on a corresponding end of the coupling portion.

* * * * *